US011908960B2

(12) United States Patent
Wu et al.

(10) Patent No.: US 11,908,960 B2
(45) Date of Patent: Feb. 20, 2024

(54) PLASMONIC METAL/GRAPHENE HETEROSTRUCTURES AND RELATED METHODS

(71) Applicant: University of Kansas, Lawrence, KS (US)

(72) Inventors: Judy Z. Wu, Lawrence, KS (US); Qingfeng Liu, Nanjing (CN)

(73) Assignee: University of Kansas, Lawrence, KS (US)

( * ) Notice: Subject to any disclaimer, the term of this patent is extended or adjusted under 35 U.S.C. 154(b) by 688 days.

(21) Appl. No.: 17/255,817

(22) PCT Filed: Jul. 3, 2019

(86) PCT No.: PCT/US2019/040559
§ 371 (c)(1),
(2) Date: Dec. 23, 2020

(87) PCT Pub. No.: WO2020/010233
PCT Pub. Date: Jan. 9, 2020

(65) Prior Publication Data
US 2021/0324512 A1 Oct. 21, 2021

Related U.S. Application Data

(60) Provisional application No. 62/694,565, filed on Jul. 6, 2018.

(51) Int. Cl.
| | |
|---|---|
| H01L 31/0216 | (2014.01) |
| C23C 16/448 | (2006.01) |
| G01N 21/65 | (2006.01) |
| H01L 31/0232 | (2014.01) |
| H01L 31/0236 | (2006.01) |
| H01L 31/028 | (2006.01) |
| H01L 31/18 | (2006.01) |

(Continued)

(52) U.S. Cl.
CPC ........ *H01L 31/02161* (2013.01); *C23C 16/18* (2013.01); *C23C 16/26* (2013.01);
(Continued)

(58) Field of Classification Search
CPC .... C23C 16/30; C23C 16/448; G01N 21/658; H01L 31/02161; H01L 31/0232;
(Continued)

(56) References Cited

U.S. PATENT DOCUMENTS

2010/0316554 A1 12/2010 Hernandez et al.
2015/0122320 A1 5/2015 Wu et al.

FOREIGN PATENT DOCUMENTS

| CN | 103286308 | 8/2015 |
|---|---|---|
| CN | 103286308 B | 8/2015 |

(Continued)

OTHER PUBLICATIONS

T.J. Echtermeyer et al., "Strong plasmonic enhancement of photovoltage in graphene," *Nature Communications*, 2:58, DOI: 10.1038/ncomms1464; pp. 1-5.
(Continued)

*Primary Examiner* — Eduardo A Rodela
(74) *Attorney, Agent, or Firm* — Bell & Manning, LLC

(57) ABSTRACT

A method of making a plasmonic metal/graphene heterostructure comprises heating an organometallic complex precursor comprising a metal at a first temperature $T_1$ for a first period of time $t_1$ to deposit a layer of the metal on a surface of a heated substrate, the heated substrate in fluid communication with the precursor; and heating, in situ, the precursor at a second temperature $T_2$ for a second period of time $t_2$ to simultaneously form on the layer of the metal, a monolayer of graphene and a plurality of carbon-encapsulated metal nanostructures comprising the metal, thereby providing the plasmonic metal/graphene heterostructure. The heated substrate is characterized by a third temperature $T_3$. The plasmonic metal/graphene heterostructures, devices incorporating the heterostructures, and methods of using the heterostructures are also provided.

20 Claims, 17 Drawing Sheets

(51) Int. Cl.
C23C 16/18 (2006.01)
C23C 16/26 (2006.01)
C23C 16/52 (2006.01)
B82Y 30/00 (2011.01)
B82Y 40/00 (2011.01)

(52) U.S. Cl.
CPC ............ *C23C 16/448* (2013.01); *C23C 16/52* (2013.01); *G01N 21/658* (2013.01); *H01L 31/028* (2013.01); *H01L 31/0232* (2013.01); *H01L 31/02363* (2013.01); *H01L 31/18* (2013.01); *B82Y 30/00* (2013.01); *B82Y 40/00* (2013.01)

(58) Field of Classification Search
CPC . H01L 31/02363; H01L 31/028; H01L 31/18; B82Y 30/00; B82Y 40/00
See application file for complete search history.

(56) References Cited

FOREIGN PATENT DOCUMENTS

| CN | 104030282 | 3/2016 |
|---|---|---|
| CN | 104030282 B | 3/2016 |
| EP | 3073251 A1 | 9/2016 |

OTHER PUBLICATIONS

Ningbo Yi et al., "A hybrid system with highly enhanced graphene SERS for rapid and tag-free tumor cells detection," *Scientific Reports*, 6:25134, DOI: 10.1038/srep25134; pp. 1-8.

Ryan Goul et al., "Quantitative analysis of surface enhanced Raman spectroscopy of Rhodamine 6G using a composite graphene and plasmonic Au nanoparticle substrate," *Carbon*, 111 (2017; pp. 386-392.

Weigao Xu et al., "Graphene-Veiled Gold Substrate for Surface-Enhanced Raman Spectroscopy," *Adv. Mater.* 2013, 25; pp. 928-933.

Ganjigunte R. Swathi Iyer et al., "Large-Area, Freestanding, single-Layer Graphene-Gold: A Hybrid Plasmonic Nanostructure," *ACS Nano* 2014, vol. 8, No. 6, pp. 6353-6362.

Congwen Yi et al., "Evidence of Plasmonic Coupling in Gallium Nanoparticles/Graphene/SiC," *small* 2012, vol. 8, No. 17, pp. 2721-2730.

Xu, Shicai, et al. "Direct Growth Graphene on Cu Nanoparticles by Chemical Vapor Deposition as Surface-Enhanced Raman Scattering Substrate for Label-Free Detection of Adenosine." *arXiv preprint arXiv:1503.00241* (2015); pp. 1-48.

The International Search Report and the Written Opinion dated Oct. 9, 2019 for International Patent Application No. PCT/US19/40559; pp. 1-9.

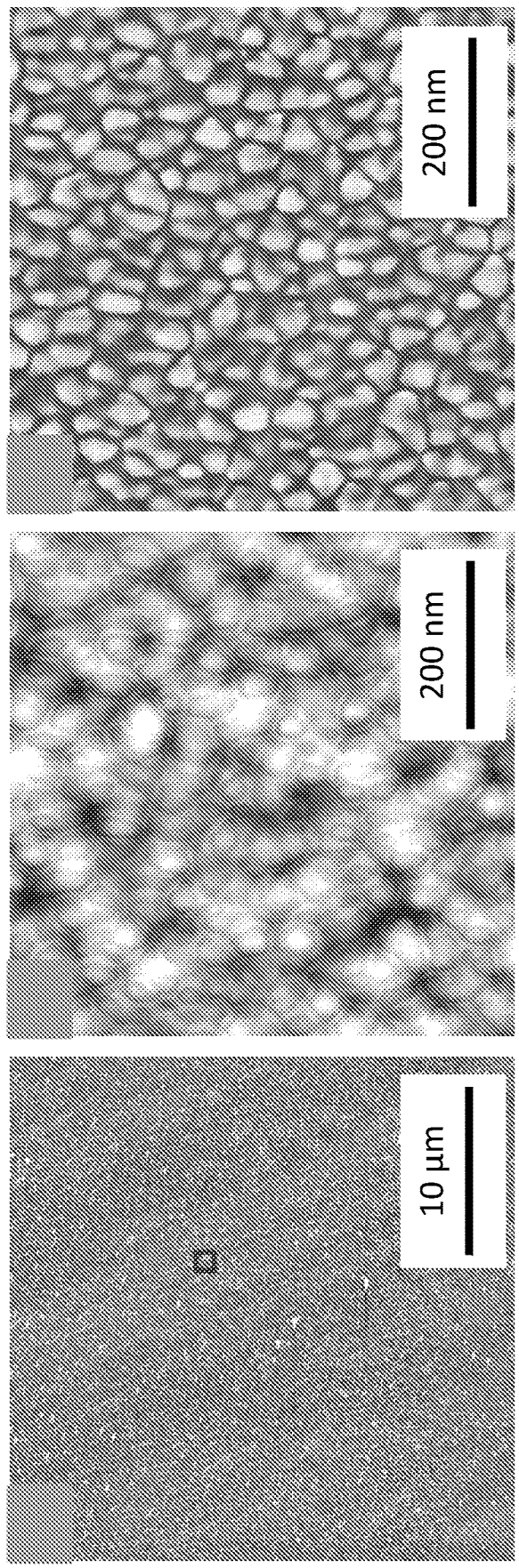

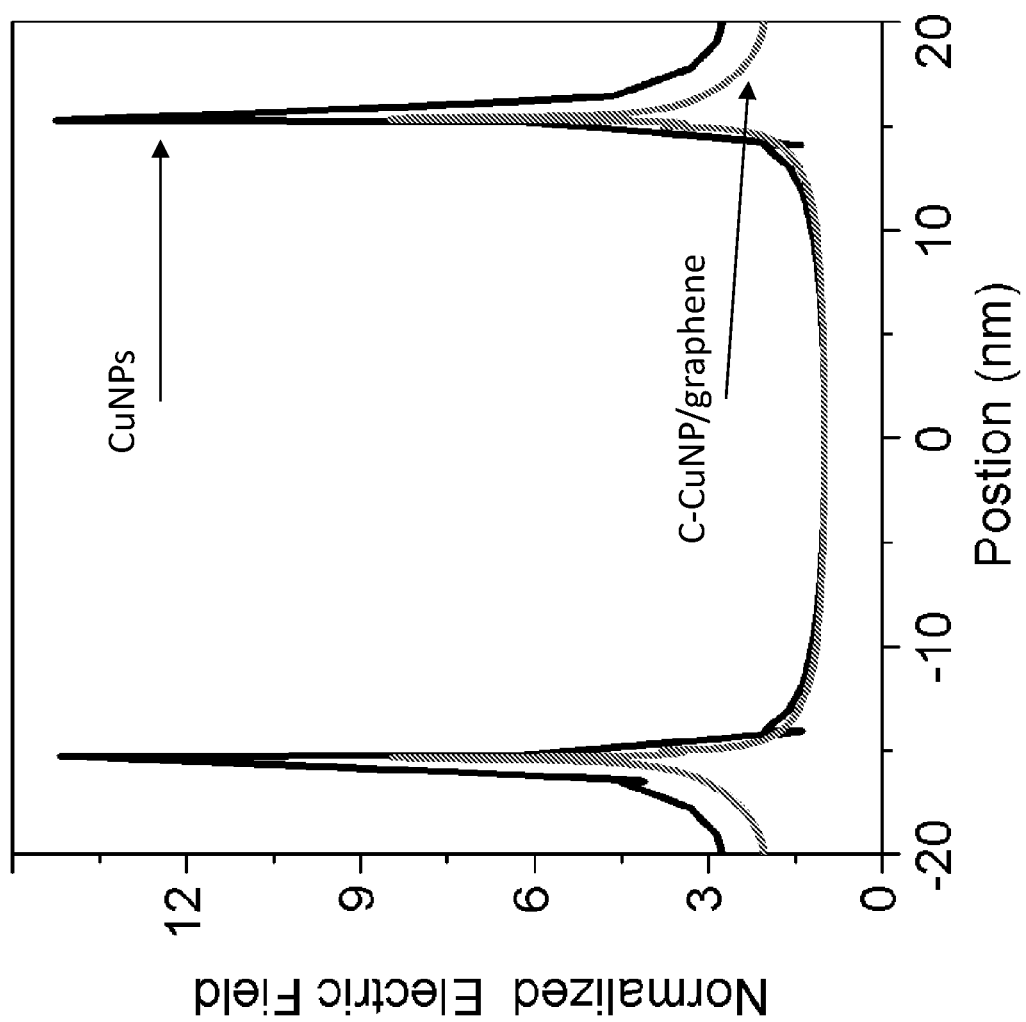

PLASMONIC METAL/GRAPHENE HETEROSTRUCTURES AND RELATED METHODS

CROSS-REFERENCE TO RELATED APPLICATIONS

The present application claims priority to U.S. Provisional Patent Application No. 62/694,565 that was filed Jul. 6, 2018, the entire contents of which are hereby incorporated by reference.

REFERENCE TO GOVERNMENT RIGHTS

This application is a National Stage of International Application No. PCT/US19/40559, filed Jul. 3, 2019, which claims the benefit of U.S. Patent Application No. 62/694,565, filed Jul. 6, 2018, the contents of which are herein incorporated by reference.

BACKGROUND

Coupling graphene with plasmonic metal (such as Cu, Ag, and Au) nanostructures has attracted considerable interest as a new class of functional materials for a variety of applications including transparent conductors, photodetectors, photocatalysts, sensors, solar cells, field effect transistors, surface-enhanced Raman scattering (SERS), etc. The combination of electromagnetic effect in light management through metal nanostructures and electrochemical effect through charge transfer to graphene provides opportunities in exploration of devices with novel electronic, optical and optoelectronic properties. However, the availability of high-quality, ambient stable, cost-effective plasmonic metal nanostructure/graphene is a prerequisite for commercialization.

SUMMARY

The present disclosure provides plasmonic metal/graphene heterostructures and methods for making and using the plasmonic metal/graphene heterostructures.

In one aspect, methods of making plasmonic metal/graphene heterostructures are provided. In an embodiment, such a method comprises heating an organometallic complex precursor comprising a metal at a first temperature $T_1$ for a first period of time $t_1$ to deposit a layer of the metal on a surface of a heated substrate, the heated substrate in fluid communication with the precursor; and heating, in situ, the precursor at a second temperature $T_2$ for a second period of time $t_2$ to simultaneously form on the layer of the metal, a monolayer of graphene and a plurality of carbon-encapsulated metal nanostructures comprising the metal, thereby providing the plasmonic metal/graphene heterostructure. The heated substrate is characterized by a third temperature $T_3$. The plasmonic metal/graphene heterostructures, devices incorporating the heterostructures, and methods of using the heterostructures are also provided.

In another aspect, plasmonic metal/graphene heterostructures are provided. In an embodiment, such a heterostructure comprises a substrate having a surface; a layer of a metal on the surface of the substrate; and a monolayer of graphene and a plurality of carbon-encapsulated metal nanostructures comprising the metal on a surface of the layer of the metal.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

FIG. 1A shows the FCCVD apparatus, and FIG. 1B shows the growth mechanism of the plasmonic C—CuNP/graphene in the in situ FCCVD process using a copper (II) phthalocyanine (CuPc) precursor.

FIGS. 2A-2I illustrate the characterization of the plasmonic C—CuNP/graphene. FIG. 2A shows a Raman spectrum (633-nm wavelength excitation) of the plasmonic C—CuNP/graphene grown at using a substrate temperature of 1050° C. The $I_{2D}/I_G$ ratio of ~2.9 confirms the formation of monolayer graphene. The inset in FIG. 2A is an image of the as-synthesized plasmonic C—CuNP/graphene sample. FIGS. 2B and 2C show X-ray photoelectron spectroscopy (XPS) C1s and Cu2p spectra of the plasmonic C—CuNP/graphene. FIG. 2D shows a low-magnification atomic force microscope (AFM) image of the C—CuNPs/graphene. FIG. 2E shows a high-magnification AFM image, and FIG. 2F shows the corresponding phase image of the plasmonic C—CuNP/graphene sample, showing uniform C—CuNPs densely covering the graphene surface. FIGS. 2G-2H show transmission electron microscope (TEM) images of the plasmonic C—CuNP/graphene sample after the $SiO_2$/Si substrate was removed. FIG. 2I shows diameter distribution of the CuNPs. The Gaussian fit to the data yields a mean radius of 31.4 nm.

FIGS. 3A-3E provide a comparison of transmission spectra of the as-synthesized plasmonic C—CuNP/graphene and transferred graphene on fused silica. FIGS. 3B-3E show simulation results of (FIG. 3B) the transmission spectra of pure CuNPs and C—CuNP/graphene, (FIG. 3C) normalized electric field distribution about the bottom of one C—CuNP, with position in the x-direction and 0 at the nanoparticle center, and (FIGS. 3D-3E) electric field distribution images normalized to the value of the incident electric field of one C—AuNP from the side x-z plane (FIG. 3D) and from above looking at the x-y plane (FIG. 3E).

DETAILED DESCRIPTION

Figure 1A:
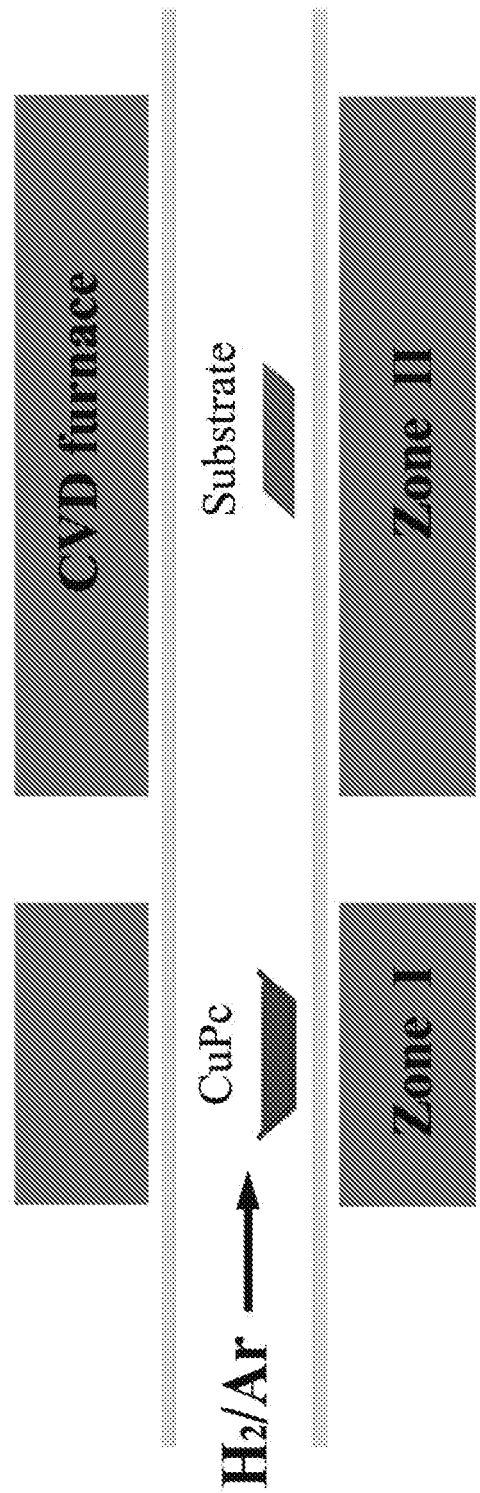
FIGS. 1A-1B provide a schematic illustration of the in situ floating catalyst chemical vapor deposition (FCCVD) fabrication process developed for synthesis of the plasmonic C—CuNP/graphene.

The present disclosure provides plasmonic metal/graphene heterostructures and methods for making and using the plasmonic metal/graphene heterostructures.

Conventional fabrication of plasmonic metal nanostructures/graphene is complicated and tedious, involving multiple steps including graphene synthesis, graphene transfer, and deposition of metal nanostructures. Such a multistep fabrication process unavoidably leads to sample contamination by impurities (especially during graphene transfer) at the surface of graphene and the interface between graphene and metal nanostructures. In addition, damage to the graphene structure during both graphene transfer and metal nanostructure deposition can degrade device performance. Moreover, for reactive metals such as Cu and Ag, the metal-graphene interface formed via various physical coating techniques including e-beam deposition, lithography, molecular beam epitaxy, thermal evaporation, and spin coating, cannot fully passivate/encapsulate the reactive metal nanostructure core, resulting in degradable plasmonic properties when the samples are exposed to external environments.

The present disclosure is directed to a FCCVD-based method which achieves precise control of metal catalytic nanostructures to induce the initial agglomeration of metal atoms into an ultrathin film on a substrate for subsequent two-dimensional (2D) graphene growth. Compared to conventional methods, at least some embodiments of the present methods are less complex (e.g., requiring fewer steps), more flexible (e.g., applicable to a wide range of substrates), and readily scalable. At least some embodiments of the resulting plasmonic metal/graphene heterostructures are characterized by superior quality (e.g., high purity, high structural integrity, and/or high stability) as compared to those formed using conventional methods.

In an embodiment, a method of making a plasmonic metal/graphene heterostructure comprises heating an organometallic complex precursor comprising a metal at a first temperature for a first period of time to deposit a layer of the metal (from the organometallic complex) on a heated substrate, the heated substrate in fluid communication with the precursor. The method further comprises heating, in situ, the precursor at a second temperature for a second period of time to simultaneously form a monolayer of graphene and a plurality of carbon-encapsulated metal nanostructures on the layer of metal. The heated substrate is characterized by a third temperature. Since the second heating step occurs in situ, the formation of the plasmonic metal/graphene heterostructure is achieved in situ. Formation of the monolayer of graphene and the carbon-encapsulated metal nanostructures occurs in a single step and does not require any graphene transfer step.

The precursor is an organometallic compound comprising a metal bound to one or more hydrocarbon groups. Thus, the precursor is a dual source, providing a source of metal (for the layer of metal and the carbon-encapsulated metal nanostructures) as well as a source of carbon (for the monolayer of graphene and the carbon-encapsulated metal nanostructures). Organometallic compounds based on a variety of metals may be used. However, the metal is one which, when in the form of a nanostructure and forming an interface with a dielectric medium, is capable of coupling with electromagnetic radiation to excite surface plasmons at the metal-dielectric interface. The metal may be selected depending upon the range of electromagnetic radiation to be coupled. By way of illustration, the electromagnetic radiation to be coupled may include radiation in the visible portion of the electromagnetic spectrum (e.g., light having wavelengths from about 400 nm to about 700 nm), etc. Illustrative metals include copper (Cu), silver (Ag), gold (Au), titanium (Ti), zinc (Zn), cobalt (Co), iron (Fe), etc. Combinations of different metals may be used (as well as combinations of different organometallic complex precursors). Pyrolysis of the organometallic complex precursors releases metal atoms that form a thin metal layer, agglomerate into metal nanoparticles (NPs) and provide a carbon source for the formation of plasmonic graphene. An illustrative precursor is a metal phthalocyanine, e.g., copper (II) phthalocyanine, titanyl phthalocyanine, zinc phthalocyanine, cobalt(II) phthalocyanine, iron(II) phthalocyanine, silver phthalocyanine, gold(II) phthalocyanine, etc.

The plasmonic metal/graphene heterostructure is formed on a substrate. A variety of substrates may be used, depending upon the application for the plasmonic metal/graphene heterostructure. Illustrative substrates include silicon-containing substrates such as $Si/SiO_2$, fused silica, and quartz. It is noted that a unique feature of the present methods is that it is not specific to the substrate. This means most substrates that are compatible with the processing conditions described in this present disclosure can be used for growth of the plasmonic metal/graphene heterostructure. The dimensions of the substrate are not particularly limited, although they may be dictated by the size of the chemical vapor deposition (CVD) system used to make the plasmonic metal/graphene heterostructure. In embodiments, the lateral dimensions of the substrate are at least 2×1 cm or 2×1 cm.

The steps of the method may be carried out in the presence of a gas or a gas mixture. The gas provides a medium to transport vaporized precursor (as well as the atomic/molecular components of decomposed prescursor) to the heated substrate. Although a variety of gases may be used, the gas is desirably inert (e.g., Ar, $H_2$, etc.). The gas may be flowed over the precursor and the substrate. The pressure of the gas may be in the range of from atmospheric pressure to 40 mTorr.

As noted above, the method involves heating an organometallic complex precursor at a first temperature for a first period of time. The first temperature may be selected to vaporize the precuror and to release a sufficient amount of metal from the vaporized precursor to deposit the layer of metal. However, the first temperature may also be selected to minimize the fragmentation and decomposition of hydrocarbon groups from the vaporized precursor. The specific first temperature depends upon the selected precursor. The first temperature is higher than the vaporization temperature (e.g., 25° C. higher than the vaporization temperature, 50° C. higher, 100° C. higher, or in the range of from 100° C. to 400° C., 150° C. to 350° C., or 200° C. to 300° C.) but less than the decomposition temperature of the selected precursor. The vaporization and decomposition temperatures may be measured using thermogravimetric curves as described in the Example below. The first period of time may be selected to achieve vaporization while minimizing fragmentation/decomposition to provide the layer of metal having desired characteristics (e.g., a desired thickness continuity of the layer, both which are further described below). Illustrative first periods of time include less than 5 min, less than 3 min, or in the range of from 1 min to 5 min.

The resulting deposited layer of metal may be characterized as being ultrathin. By "ultrathin" it is meant that the thickness of the layer of metal is no more than 5 nm, no more than 2 nm, or no more than 1 nm. This thickness may be an average thickness as measured (e.g., via AFM) from a representative number of locations across the layer of metal. The deposited layer of metal may also be characterized as being continuous across the surface of the substrate (e.g., from one edge of the substrate to an opposing edge). By "continuous" it is meant that the layer forms an unbroken coating on the surface, although due to the inherent nature of the deposition technique, there may be a small number of imperfections (i.e., disruptions) in the coating. However, these disruptions, which may appear as "holes" or "voids" in the layer revealing bare substrate, generally have lateral dimensions less than 50 nm, less than 30 nm, or less than 20 nm, etc., and depths of 1 nm or less (See FIG. 5.) The continuous layer of metal is distinguished from a layer of metal which has dewetted from an underlying substrate to form a plurality of discrete regions of metal on the substrate and significantly larger regions of exposed substrate. Continuity may be confirmed via AFM or optical images.

Next, the method involves heating the precursor at a second temperature for a second period of time. The second temperature is higher than the first temperature. The second temperature also vaporizes the precuror and releases metal, but additionally induces fragmentation and decomposition of hydrocarbon groups from the vaporized precursor. The second temperature may be selected to achieve a sufficient amount of fragmentation/decomposition to form a monolayer of graphene on the surface of the layer of metal. Confirmation of the formation of a monolayer of graphene may be determined by using Raman spectroscopy as described in the Example, below. At the same time, the metal being released from the vaporized precursor deposits in the form of nanosized metal agglomerates, i.e., metal nanostructures. Also at the same time, the carbon produced from fragmentation/decomposition deposits on the surface of the metal nanostructures, forming a coating thereon. Thus, the second temperature may also be selected to tune the fragmentation/decomposition to achieve this monolayer of graphene decorated with a plurality of carbon-encapsulated metal nanostructures.

The specific second temperature also depends upon the selected precursor. Although the second temperature is higher than the first temperature and sufficiently high to induce fragmentation/decomposition, the second temperature may be less than the decomposition temperature of the selected precursor (as measured using thermogravimetric curves), e.g., 10° C. less than the decomposition temperature, 25° C. less, 50° C. less, or in the range of from 100° C. to 500° C., 150° C. to 500° C., or 200° C. to 500° C. The second period of time may be selected to tune the fragmentation/decomposition as described above as well as to provide the plasmonic metal/graphene heterostructure having desired characteristics (e.g., monolayer of graphene characteristics, metal nanostructure characteristics, encapsulation characteristics, desired properties, each of which is further described below). The second period of time may be greater than the first period of time. Illustrative first periods of time include more than 5 min, more than 8 min, or in the range of from 5 min to 15 min.

Figure 4A:
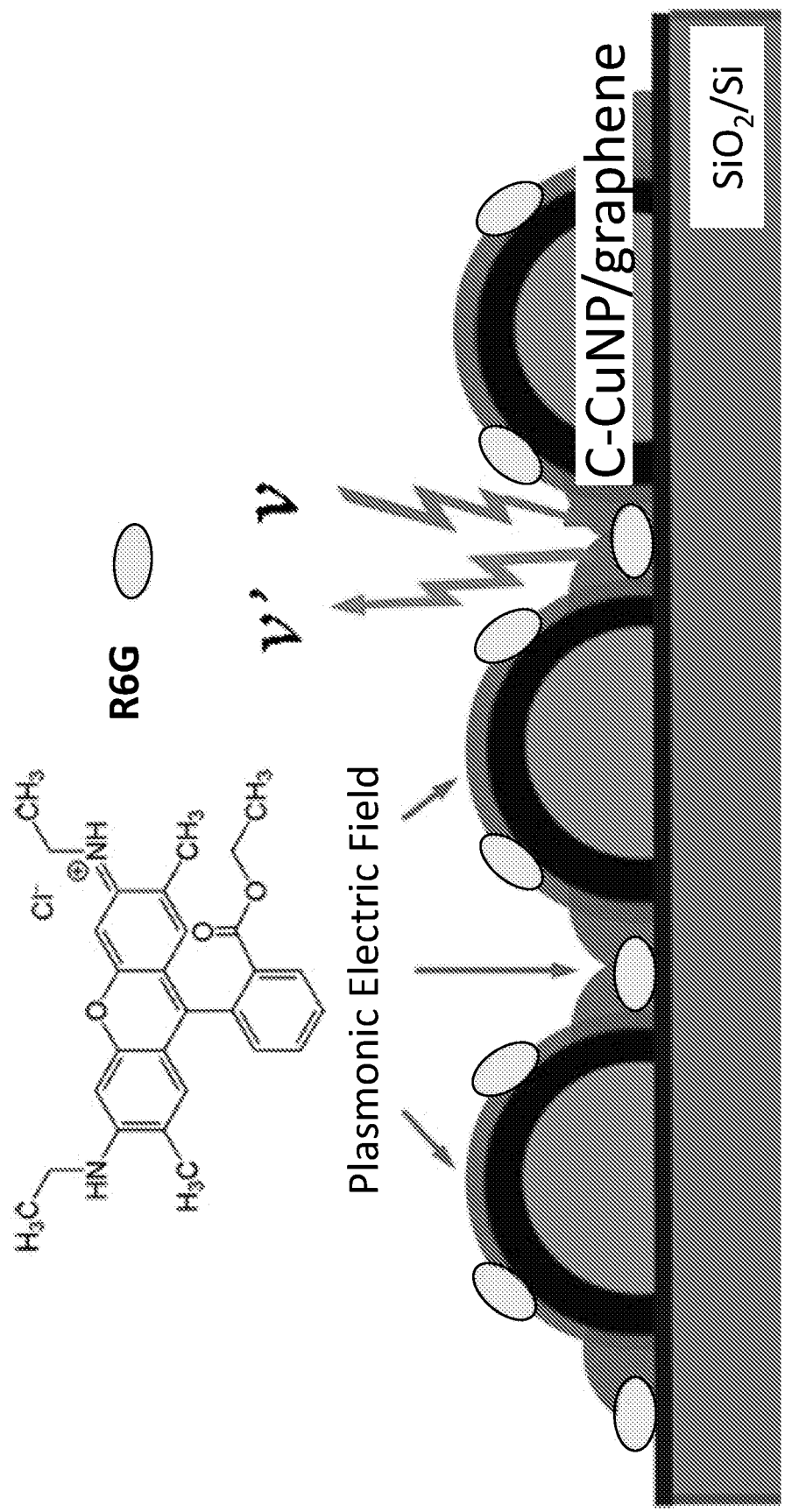
FIG. 4A shows a diagram of surface enhanced Raman scattering (SERS) on the plasmonic C—CuNP/graphene with a plasmonic electric field.
Figure 4B:
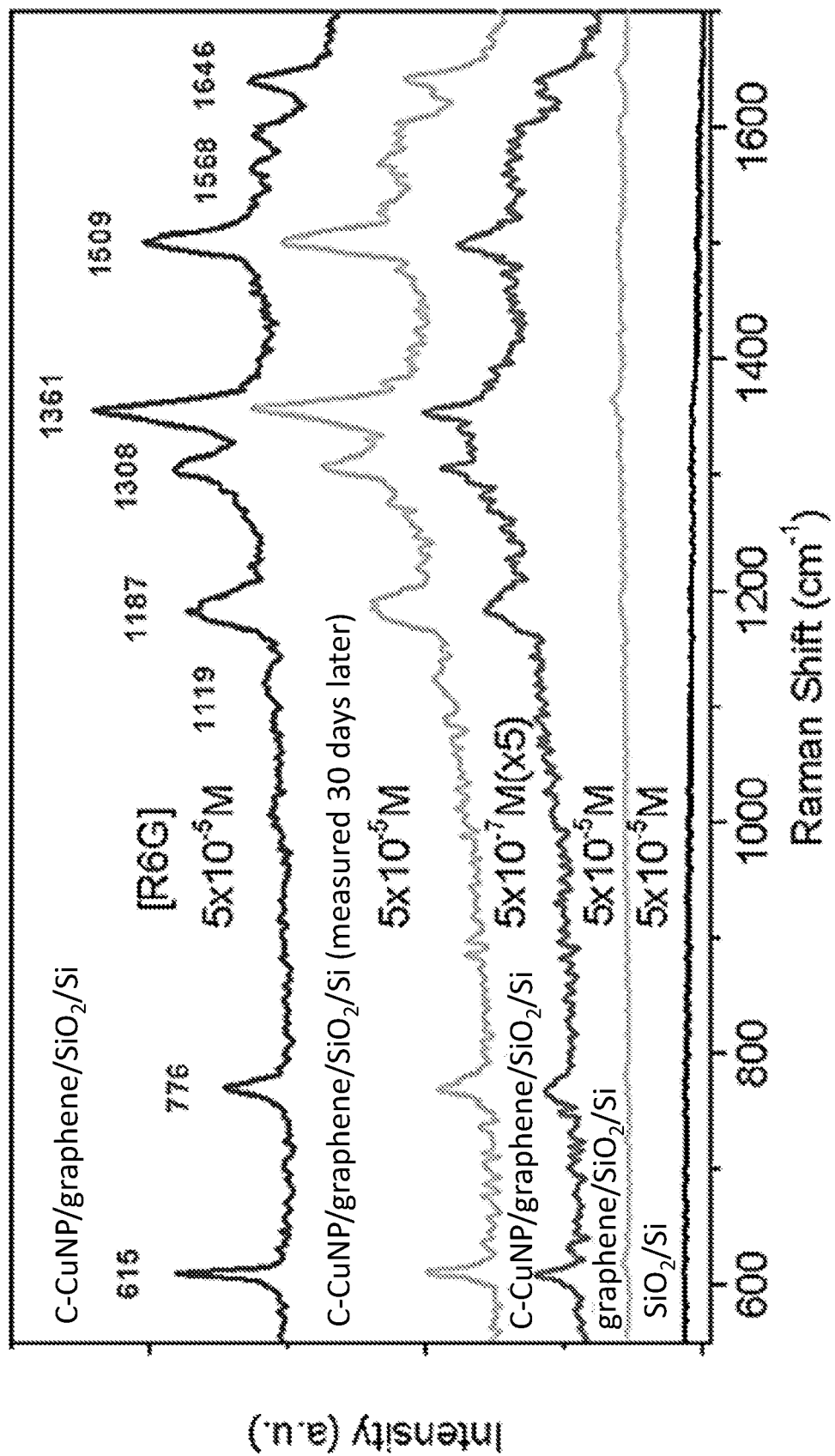
FIG. 4B shows comparisons of Raman spectra (633-nm wavelength) for R6G (Rhodamine 6G) on plasmonic C—CuNP/graphene/$SiO_2$/Si (top three curves), transferred-graphene/$SiO_2$/Si ($2^{nd}$ to bottom), and $SiO_2$/Si (bottom). Curves have been shifted without changing the magnitudes. Spectra are offset from one another and share a common scale with the exception of the $5 \times 10^{-7}$ M spectrum, which was scaled up by a factor of 5 to make it easier to compare with other spectra.
Figure 6:
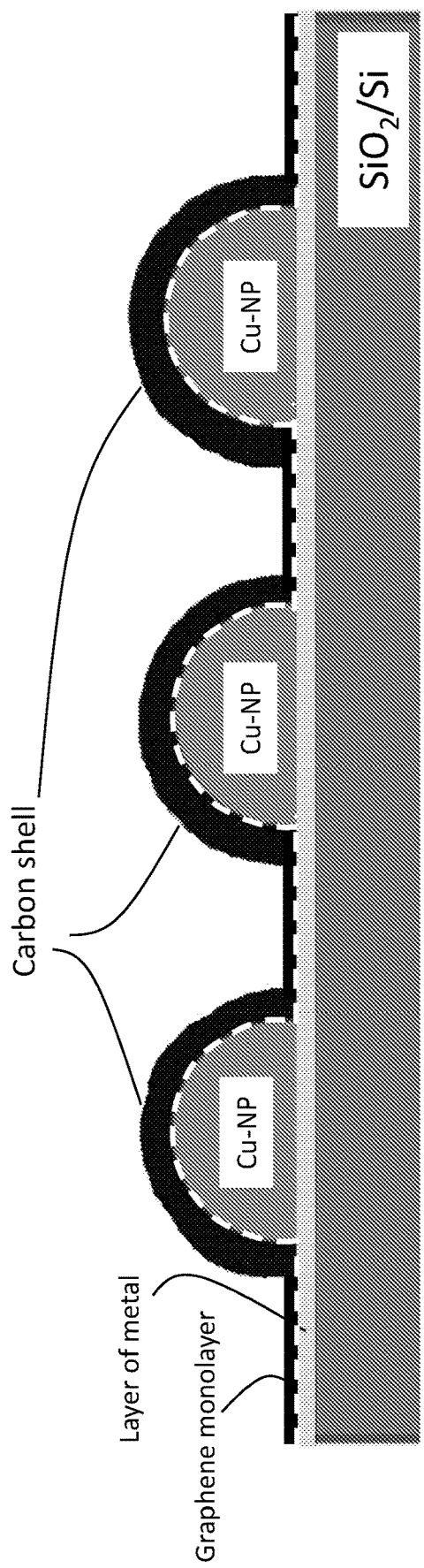
FIG. 6 is a schematic illustration of plasmonic C—CuNP/graphene according to an illustrative embodiment.

The monolayer of graphene may be characterized as being continuous, analogous to that described above with respect to the deposited metal. For embodiments as shown in FIG. 6, continuous may refer to the regions between the carbon-encapsulated metal nanostructures. However, as noted below, at least some of the carbon-encapsulated metal nanostructures may have graphene underneath as shown in FIG. 4B. The monolayer of graphene may also be characterized by its quality, which may be quantified by the ratio of the intensity of the D band to the intensity of the G band ($I_D/I_G$) by using Raman spectroscopy as described in the Example below. In embodiments, the $I_D/I_G$ value of the monolayer of graphene is less than 0.3, less than 0.2, less than 0.15, etc.

The carbon-encapsulated metal nanostructures may be characterized by their shape, size, and distribution in the plasmonic metal/graphene heterostructure. The particular value of the parameters is not particularly limited, but rather depends upon the desired optical properties for the plasmonic metal/graphene heterostructure, i.e., since the scattering, absorbance, and coupling properties of plasmonic nanostructures depend upon their geometries and relative positions.

The shape of the carbon-encapsulated metal nanostructures may be regular (e.g., well-defined by a circle, ellipse, ovoid, cylinder, etc.). (See FIGS. 2G and 2H.) The nanostructures may be characterized by a diameter (circle), a major diameter (ellipse), or a width taken as the maximum distance across the nanostructure (for other shapes). These dimensions may be determined from TEM images such as that shown in FIG. 2H. The dimensions may be reported as an average dimension, by which is meant an average value from a representative number of nanostructures. In embodiments, the average diameter/width is less than 100 nm, less than 50 nm, less than 30 nm, or less than 20 nm. This includes embodiments in which the average diameter/width is in the range of from 10 nm to 100 nm. The nanostructures may have relatively small aspect ratios, e.g., from 1 to 2.

The carbon-encapsulated metal nanostructures may be further characterized by the distribution of the sizes of the nanostructures in the plasmonic metal/graphene heterostructure. The distribution may be uniform. By "uniform" it is meant that the sizes (e.g., diameters) of the nanostructures are within ±5%, ±1%, ±0.5%, or ±0.2% of the average size. (See FIG. 2I.)

The carbon-encapsulated metal nanostructures may be further characterized by the distribution of nanostructures within the plasmonic metal/graphene heterostructure. The distribution may be uniform, by which it is meant that the nanostructures are separated from each other by equal amounts, although not necessarily perfectly equal. (See FIG. 2F.) The average spacing value between neighboring nanostructures may vary, depending upon the desired optical properties. In embodiments, the average spacing value is in the range of from 1 nm to 20 nm, or from 5 nm to 10 nm.

The carbon-encapsulated metal nanostructures may be further characterized by the thickness of the carbon coating on the metal nanostructures. In embodiments, the thickness of the carbon coating is consistent with that of a graphene monolayer, i.e., the metal nanostructures are themselves coated with a monolayer of graphene. In other embodiments, the thickness of the carbon coating is consistent with that of two or three monolayers of graphene.

As noted above, the substrate on which the plasmonic metal/graphene heterostructure is formed is heated. The heated substrate may be characterized by a third temperature. Although a variety of third temperatures may be used, the third temperature is greater than the second temperature and is generally substantially greater, e.g., in the range of from about 1000° C. to about 1090° C.

The method may be carried out using a multi-zone (e.g., dual zone) chemical vapor deposition system. The different zones may be used to house and heat the precursor and the substrate.

The present disclosure also encompasses the plasmonic metal/graphene heterostructures themselves. In an embodiment, a plasmonic metal/graphene heterostructure comprises a substrate, a layer of metal on (e.g., directly on) the surface of the substrate, a monolayer of graphene on (e.g., directly on) and a plurality of carbon-encapsulated metal nanostructures on (e.g., directly on) the surface of the layer of metal. Composition and characteristics of the substrate, the layer of metal, the monolayer of graphene, and the carbon-encapsulated metal nanostructures have been described above.

Due to the unique methods described herein, in the plasmonic metal/graphene heterostructures, the monolayer of graphene and the carbon of the plurality of carbon-encapsulated metal nanostructures effectively provide a continuous carbon layer in which the metal nanostructures are embedded. (Continuous has a meaning analogous to that described above.) In addition, this continuous carbon layer forms a continuous interface with each metal nanostructure of the plurality of carbon-encapsulated metal nanostructures and with the layer of the metal between neighboring metal nanostructures of the plurality of carbon-encapsulated metal nanostructures. This continuous interface is represented with a dashed line in FIG. 6. As such, the metal nanostructures are completely encapsulated by, and completely passivated, by carbon (except for the region in contact with the underlying layer of metal on which they are formed). As a result, they are not accessible to the ambient environment and are much more stable (e.g., providing stable optical properties) as compared to heterostructures formed using conventional methods. For example, conventional methods employ graphene synthesis, graphene transfer, and/or metal nanoparticle functionalization which cannot completely encapsulate/passivate the metal nanoparticles. As noted above, at least some of the metal nanostructures may have graphene underneath as shown in FIG. 4B.

The plasmonic metal/graphene heterostructures may also be characterized by their properties, e.g., plasmonic material purity, stability, and/or optical properties. Regarding purity, the metal may be free of impurities, e.g., free of elements other than the selected metal. By "free" it is meant that the level of these other elements is zero or so low so as not to materially affect the optical properties of the heterostructure. Regarding stability, the carbon-encapsulation is useful to shield reactive metal nanostructures from the ambient environment (e.g., corrosion, oxidation, etc.). Thus, in embodiments, the plasmonic metal/graphene heterostructures are highly stable, e.g., as evidenced by optical properties which do not change significantly over long periods of time, e.g., a month, six months, a year, etc. (See FIGS. 3A and 4B.)

Figure 3A:
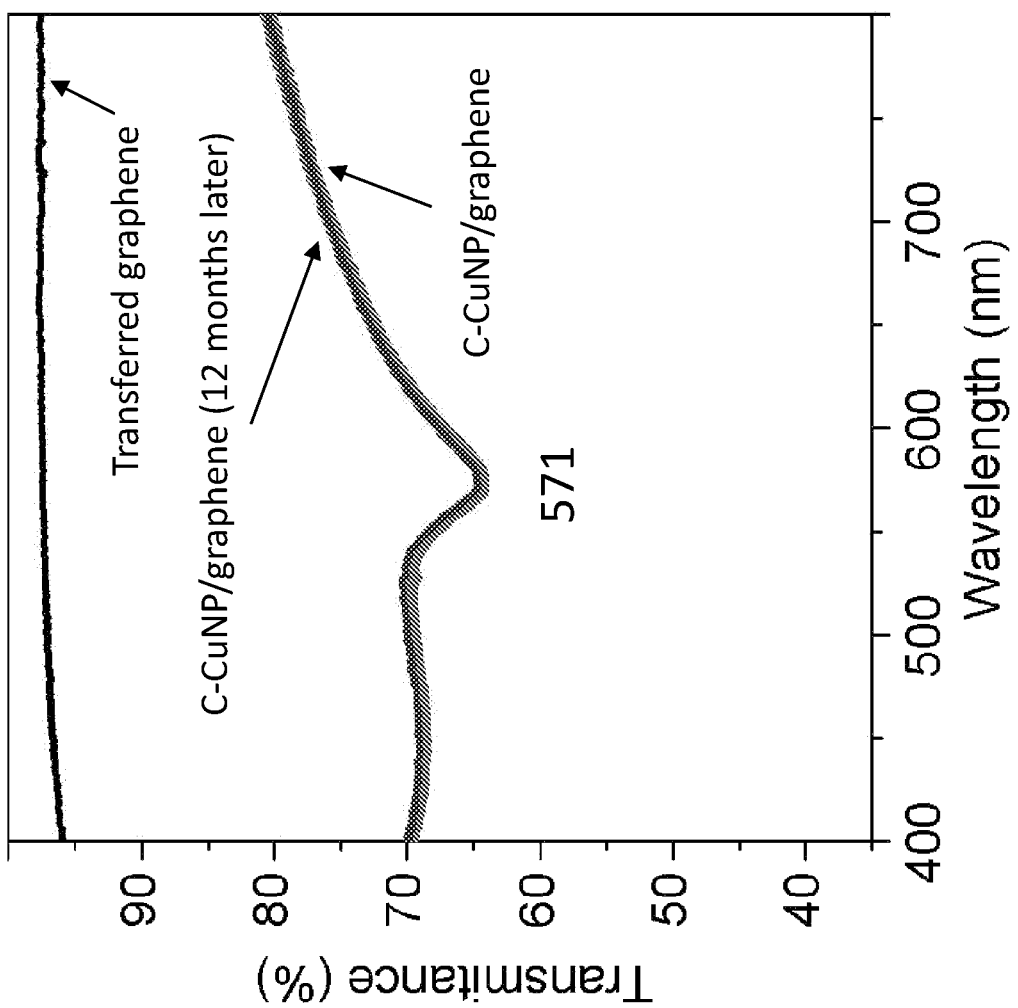

The plasmonic metal/graphene heterostructures may be characterized by their optical properties, e.g., absorbance as measured from absorbance/transmission spectra as described in the Example below. Such spectra also confirm the plasmonic nature of the heterostructures. The spectra may be characterized by one (fundamental) or more (harmonics) plasmonic resonance peaks, the specifications of which (e.g., peak wavelength, spectral width) depend upon the characteristics of the carbon-encapsulated metal nanostructures (e.g., shape, size, and distribution of the nanostructures, type of metal, etc.). By way of illustration, FIG. 3A shows a plasmonic resonance peak at about 571 nm for a plasmonic metal/graphene heterostructure formed according to the Example, which corresponds to carbon-encapsulated Cu nanostructures.

The present disclosure also encompasses devices incorporating the plasmonic metal/graphene heterostructures. Such devices include a variety of optoelectronic devices and sensors. Methods for using such devices are also provided. In an embodiment, a method comprises illuminating any of the disclosed plasmonic metal/graphene heterostructures with electromagnetic radiation to excite surface plasmons at the metal-carbon interface. The method may further comprise detecting scattered light from the surface of the plasmonic metal/graphene heterostructure. Such a method is the basis for using the present plasmonic metal/graphene heterostructures as a sensor, e.g., to detect a variety of chemical or biological compounds via SERS. The sensitivity of such sensors, as measured using the technique described in the Example below, may be significantly greater than comparative sensors using plasmonic metal/graphene heterostructures formed using conventional methods, e.g., those based on graphene synthesis, graphene transfer, and metal nanoparticle functionalization. The enhancement in sensitivity may be quantified by comparing the intensity of a SERS peak of a dye molecule, R6G, using 632 nm illumination as described in the Example below. The enhancement in sensitivity as compared to a comparative sensors may be referred to as an enhancement factor. The enhancement factor may be, e.g., 10, 20, 50, 100, etc.

EXAMPLE

Introduction

This Example reports the first successful FCCVD synthesis of large-area monolayer graphene decorated by plasmonic carbon-encapsulated CuNPs (C—CuNPs) on a variety of substrates (e.g., Si/SiO$_2$, fused silica, and quartz) using pyrolysis of copper (II) phthalocyanine (CuC$_{32}$N$_8$H$_{16}$, CuPc). A unique advantage of this FCCVD process is that pyrolysis of CuPc simultaneously provides both the Cu and carbon source required for plasmonic C—CuNP/graphene growth, significantly simplifying the fabrication process for plasmonic metal-nanostructure/graphene. Key to this success includes the selection of a CuPc precursor for Cu and C sources and the development of a novel two-step FCCVD process by in situ variation of the processing parameters to achieve an ultrathin Cu film on substrates for 2D graphene growth, followed with high-concentration beaded CuNPs nucleation on graphene for the plasmonic effect. This FCCVD process is advantageous over the existing ex situ fabrication methods for plasmonic metal nanostructures/graphene. Firstly, since the C—CuNP/graphene fabrication is completed in situ, it allows a high-performance plasmonic effect to be obtained while eliminating the detrimental sample damage and contamination occurring during graphene transfer, graphene cleaning, and synthesis of plasmonic nanostructures on graphene. Secondly, the plasmonic C—CuNP/graphene can be directly generated in a run-to-run manner on many functional substrates on a large scale. Finally, the CuNPs can catalyze graphene growth atop to form a carbon shell that is protective against degradation of the CuNP core in air. Consequently, the C—CuNP/graphene has high stability against corrosion and chemical reactions because the reactive Cu core is fully passivated by the impermeable graphitic shells, shielding it from external environments. To illustrate the localized SERS for high-sensitivity biosensing, detection of R6G molecules using the C—CuNP/graphene/SiO$_2$/Si substrate was performed with high sensitivity up to $5 \times 10^{-7}$ M using a 632-nm excitation laser.

Experimental

FCCVD synthesis of plasmonic CuNP/graphene: The FCCVD synthesis was performed in a quartz tube reactor (25 mm in diameter) inside a horizontal dual-zone CVD furnace. In a typical experiment, the clean substrates were placed in Zone II of the quartz tube reactor. A mixed H$_2$ (300 sccm)/Ar (500 sccm) flow was introduced in the reactor while it was heated up to growth temperatures of 1050° C.

(corresponding to a temperature of 1050° C. for the heated substrate). A quantity of CuPc powder was sublimated in Zone I at 300° C. for 2 min (first temperature and time) and then at 450° C. for 10 min (second temperature and time). The vaporized CuPc was transported into Zone II by the gas flow and also decomposed in Zone II, while the CuNP/graphene formed on the substrate surface. After the growth, the furnace was quickly cooled to room temperature under the protection of the $H_2$/Ar flow.

Characterization: Raman spectra were taken on a confocal Raman system (WiTec alpha300) with a laser excitation of 488 nm. The surface morphology of the samples was examined using an Agilent 5500 atomic force microscope (Agilent Technologies, Tempe, AZ). TEM images were taken with Tecnai F20 equipped with an energy dispersive spectrometer. The XPS spectra were taken using an AXIS Ultra (Kratos) system. The transmittance spectra were obtained with a Varian 50 Bio UV-visible spectrophotometer.

Results and Discussion

Figure 1B:
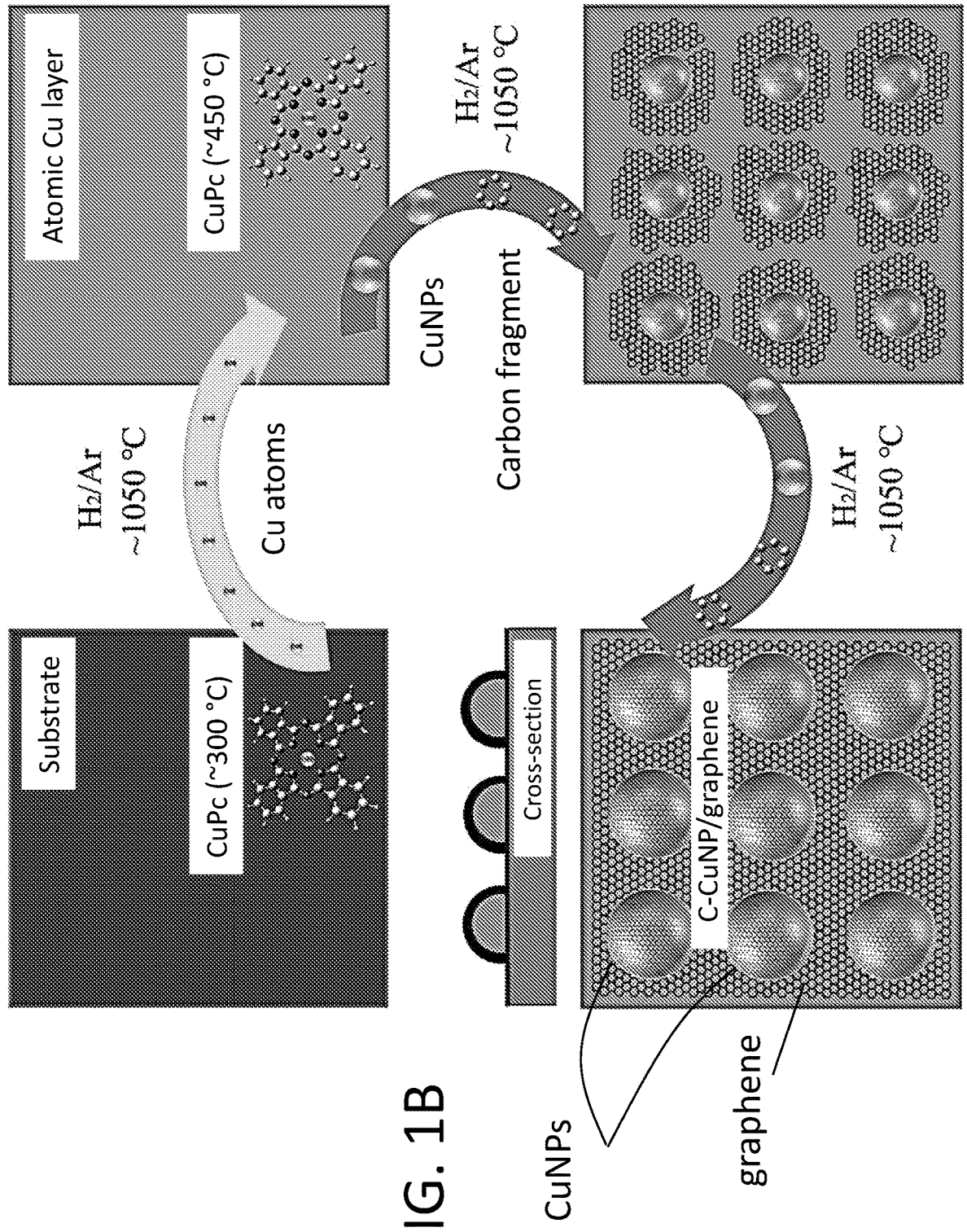

The FCCVD synthesis was carried out by pyrolysis of CuPc at 1050° C. under Ar/$H_2$ in a quartz tube reactor (25 mm in diameter) inside a horizontal dual-zone CVD furnace. The CuPc precursor was placed in Zone I of a lower temperature and the evaporated CuPc was transferred into Zone II of a higher temperature by a carrier gas of mixed $H_2$ (300 sccm) and Ar (500 sccm), as shown in FIG. 1A. The CuPc began to vaporize at about 200° C. and decomposed above 500° C. (determined from thermogravimetric curves (not shown)). A slower CuPc evaporation at 300° C. for 2 min was selected to release Cu atoms to allow coating of an ultrathin (~1 nm, see discussions later) Cu layer on the substrate. It should be noted that the ultrathin Cu layer serves as a highly catalytic material to convert carbon fragments to graphene on its surface. Faster CuPc evaporation at 450° C. followed immediately to accelerate graphene growth on the ultrathin Cu catalytic layer. Within the short time frame of 10 min, a continuous monolayer graphene sheet was obtained. The accelerated Cu deposition also occurs simultaneously to form the CuNPs encapsulated by graphitic shells. The result is transfer-free plasmonic C—CuNP/monolayer graphene on wafer-size substrates. The whole FCCVD process is summarized schematically in FIG. 1B.

Figure 5:
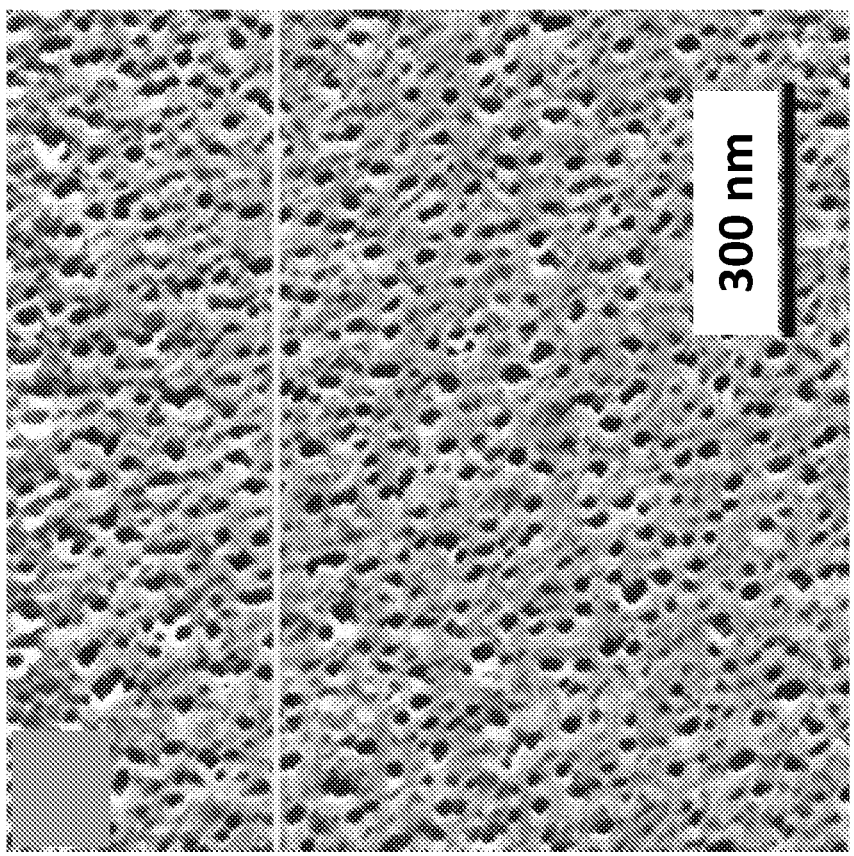
FIG. 5 shows an AFM image of an ultrathin Cu layer formed via pyrolysis of CuPc, which had been vaporized at 300° C. for 2 min. There is a plurality of nanoscale voids, but because the voids are so small, the ultrathin Cu layer may be characterized as being continuous.

AFM images of a $SiO_2$/Si substrate before and after the evaporation of CuPc at 300° C. for 2 min were obtained. The clean surface of the $SiO_2$/Si substrate was coated by an ultrathin, continuous Cu layer after the evaporation of the CuPc source at 300° C. for 2 min. The continuous Cu layer is shown in FIG. 5. Nanoscale voids of lateral and vertical dimensions of 10-30 nm and ~1 nm, respectively, were clearly visible on the Cu film. A fundamental difference between the present in situ deposited Cu ultrathin film and an ex situ one is the absence of dewetting and reconstruction of the in situ Cu ultrathin film at the graphene growth temperature >1000° C., since the contact angle of liquid Cu on $SiO_2$ is 50°-110°. This is critical to the 2D growth of a graphene sheet in FCCVD. By contrast, the de-wetting and reconstruction of ex situ deposited Cu films prevents the growth of continuous CVD graphene sheets on Cu-coated substrates. AFM images (not shown) of dewetted Cu-coated substrates reveal large micron-sized patches of the underlying substrate. By contrast, the image of FIG. 5 shows that the nanosized voids are so small that the Cu film is effectively a continuous film. Without wishing to be bound to any particular theory, the presence of a trace amount of C in the ultrathin Cu film may dramatically reduce the surface tension of the Cu film on the $SiO_2$ surface and therefore inhibit/prevent dewetting.

Although pyrolysis of hydrocarbons can form a continuous graphene sheet on a $SiO_2$ surface without any metal catalysts, significantly longer growth times must be used. The presence of an ultrathin Cu film on substrates is therefore advantageous to enable the high-speed growth of graphene with high quality. The subsequent evaporation of CuPc at a higher temperature of 450° C. accelerates CuPc pyrolysis to release more carbon fragments, which are converted into a continuous monolayer graphene sheet on the ultrathin Cu catalytic layer within the short time frame of 10 min. Meanwhile, accelerated Cu deposition occurs simultaneously on the graphene surface to form CuNPs, since the contact angle is in the range of 120°-125° of the liquid Cu on graphite. Also, carbon fragments from the CuPc precursor absorb on these CuNPs to form the shielding graphitic shells thereon. Thus, this FCCVD process enables in situ synthesis of 2D plasmonic C—CuNP/monolayer-graphene directly on wafer-size substrates.

Figure 2A:
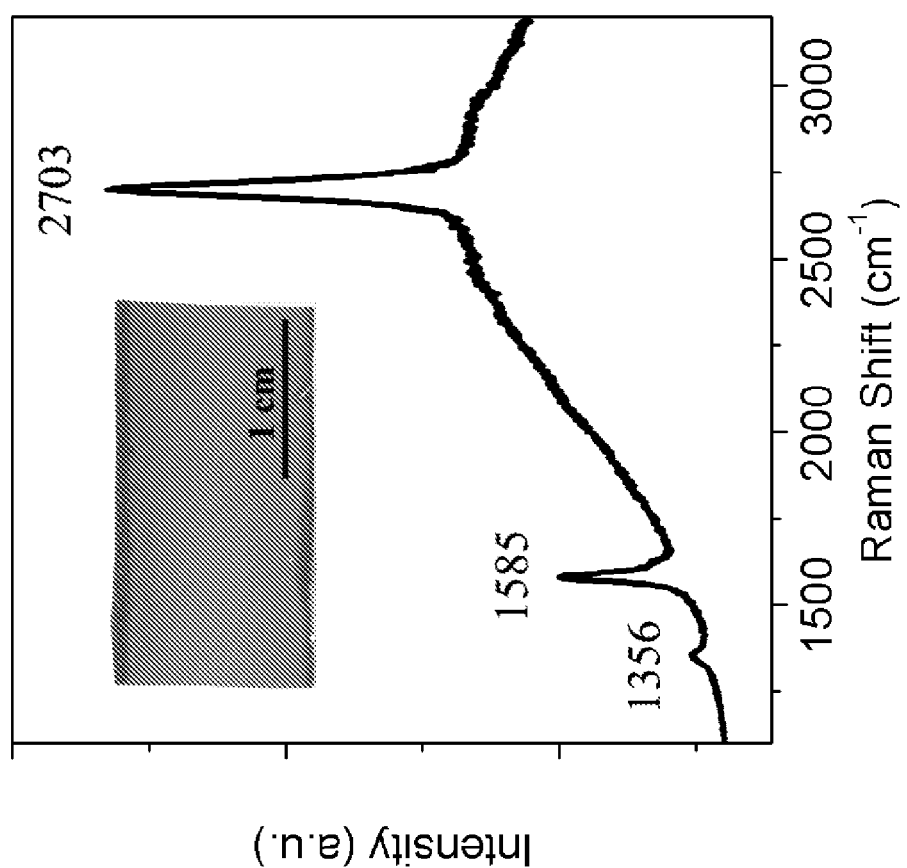

The inset of FIG. 2A shows a representative sample of the as-synthesized C—CuNP/graphene on a $SiO_2$/Si substrate. This sample exhibits a light red wine color, which comes from the dense C—CuNPs population. FIG. 2A shows the typical Raman spectrum of the sample with three peaks, i.e., 2D band at 2703 $cm^{-1}$, G band at 1582 $cm^{-1}$, and D band at ~1356 $cm^{-1}$. The intensity ratio of the 2D band to the G band ($I_{2D}/I_G$) is ~2.9, which is characteristic of monolayer graphene. The relatively small D band with the $I_D/I_G$ ratio of ~0.15 indicates the high quality of the monolayer graphene. Raman spectra recorded around 20 arbitrary locations over the whole sample show similar features, revealing the homogenous formation of the monolayer graphene. To confirm the critical importance of the ultrathin Cu film generated in the first step of the FCCVD, a Raman spectrum of a sample made using only the second-step evaporation of CuPc at 450° C. and 10 minutes was obtained. The sample is highly defective as indicated by an intense D peak.

Figure 2B:
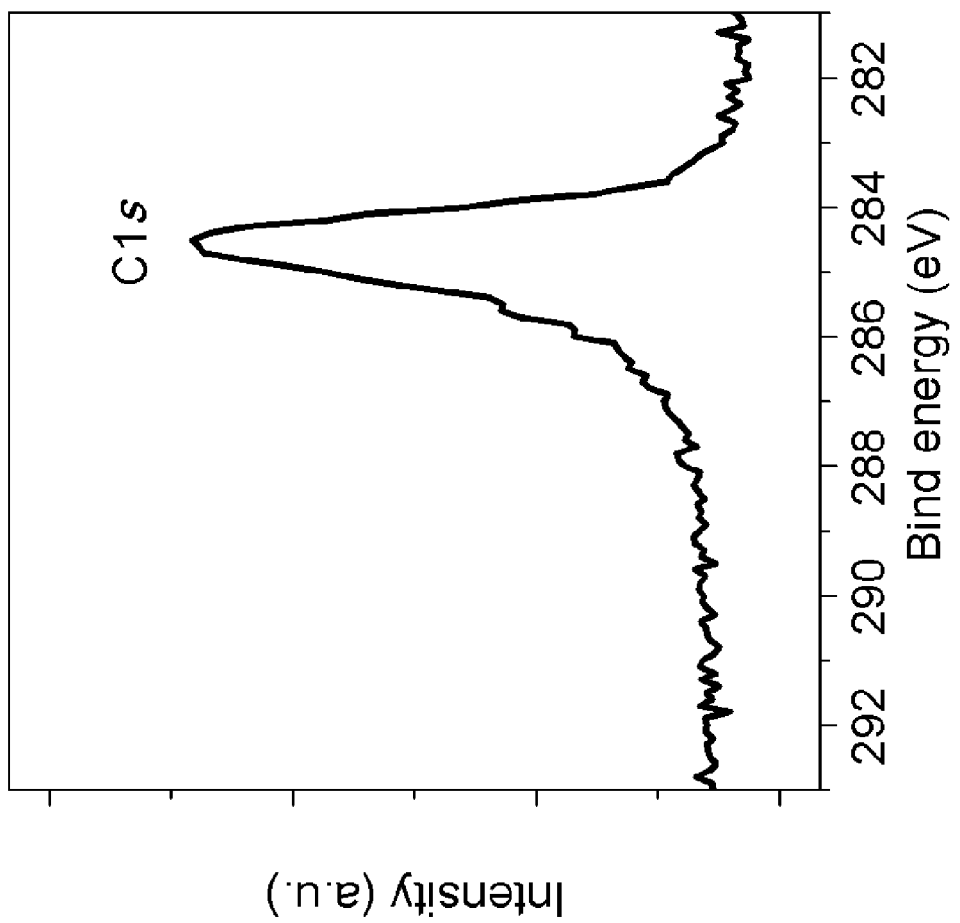
Figure 2C:
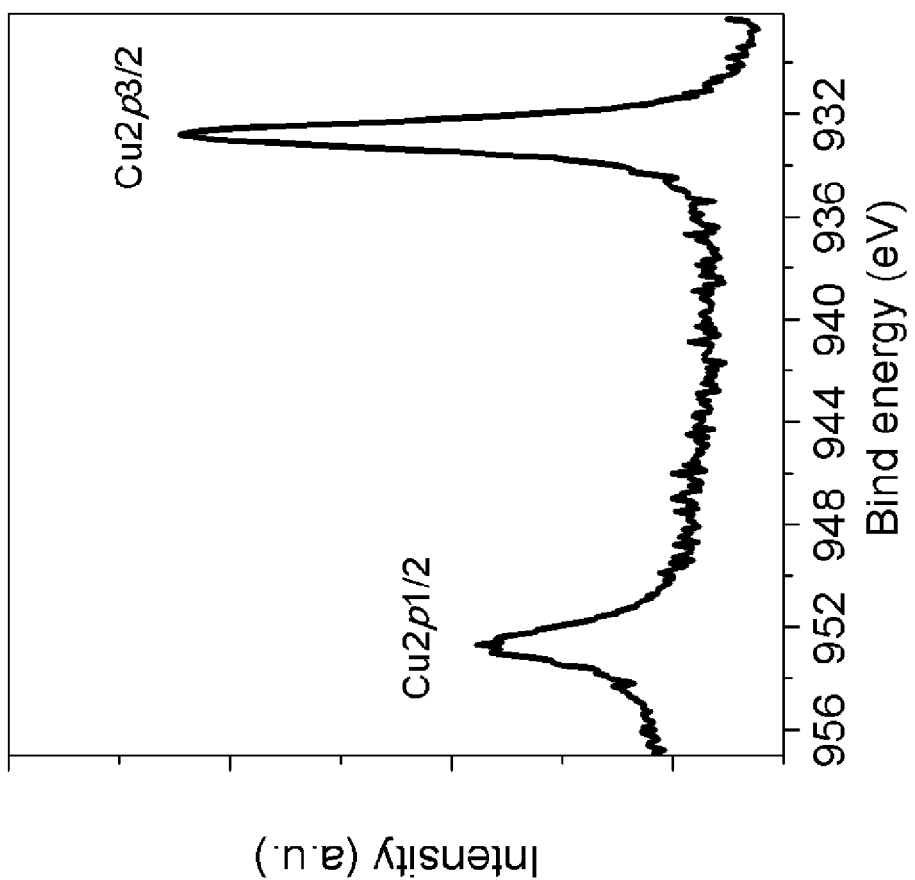

XPS was used to characterize the C—CuNP/graphene. A representative XPS survey spectrum of the sample of FIG. 2A was obtained (not shown). Besides the expected O and Si peaks with the O/Si atomic ratio of ~2 from the Si/$SiO_2$ substrate, the XPS peaks for C and Cu appeared in the spectrum. The high-resolution C1s spectrum (FIG. 2B) exhibits a graphitic C peak at 284.4 eV, which arises from the $sp^2$ hybridized carbon free from O.[27] FIG. 2C shows the typical Cu2p1/2 and Cu2p3/2 peaks of 952.6 eV and 932.8 eV, respectively, revealing the existence of pure Cu core (~17.4 at. %) in the as-synthesized C—CuNP/graphene and thus, the absence of impurities.

The surface morphology of the plasmonic C—CuNP/graphene was characterized using atomic force microscopy (AFM). After FCCVD growth for 10 min, the clean surface of $SiO_2$/Si substrate was fully covered by a layer of plasmonic C—CuNP/graphene, as shown in FIG. 2D. High-magnification AFM image (FIG. 2E) reveals that the C—CuNPs are encapsulated by graphitic layers and are tightly anchored on the graphene surface, while the corresponding phase AFM image (FIG. 2F) shows the dimensions of the C—CuNPs and the spacing (~5-10 nm) between them. This unique configuration not only effectively shields the reactive Cu cores from corrosion or oxidation, (thus, eliminating the material damping and scattering losses originating from an unintentional $Cu_2O$ or CuO layer) but also inhibits/prevents interference with inducing localized surface plasmons.

Figure 2G:
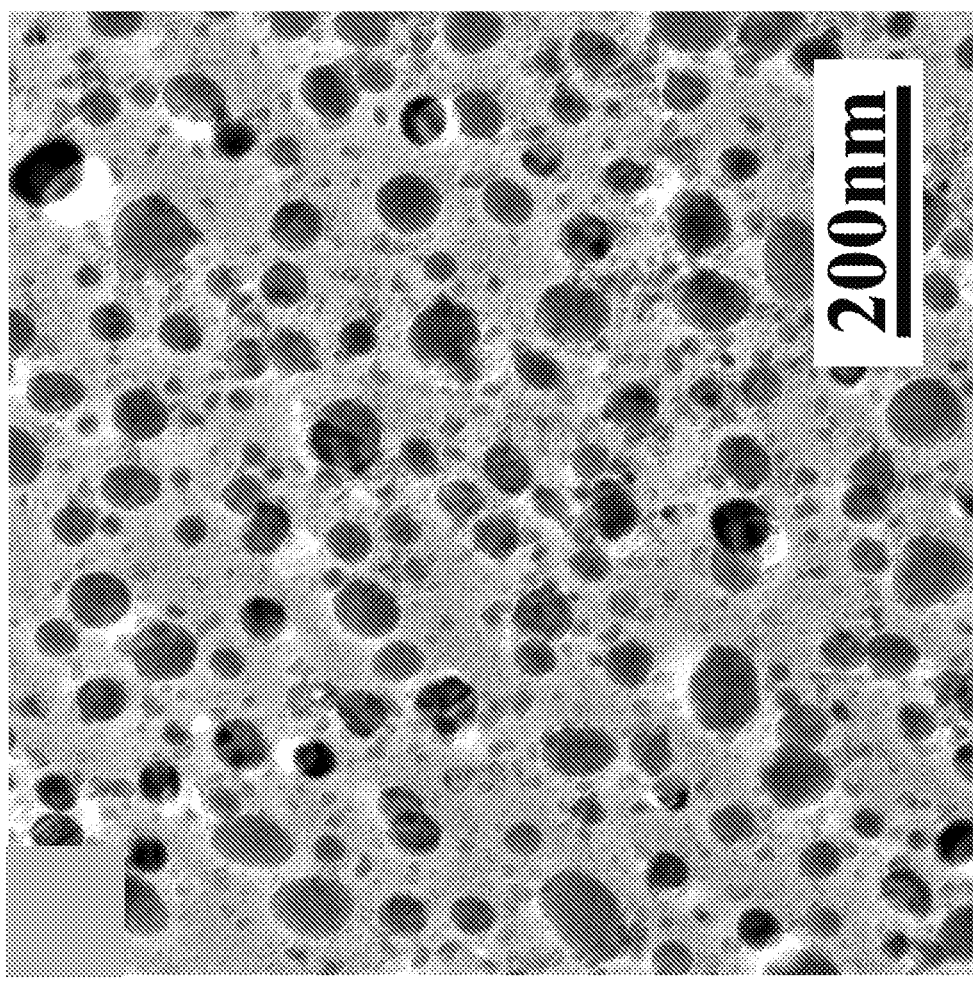
Figure 2H:
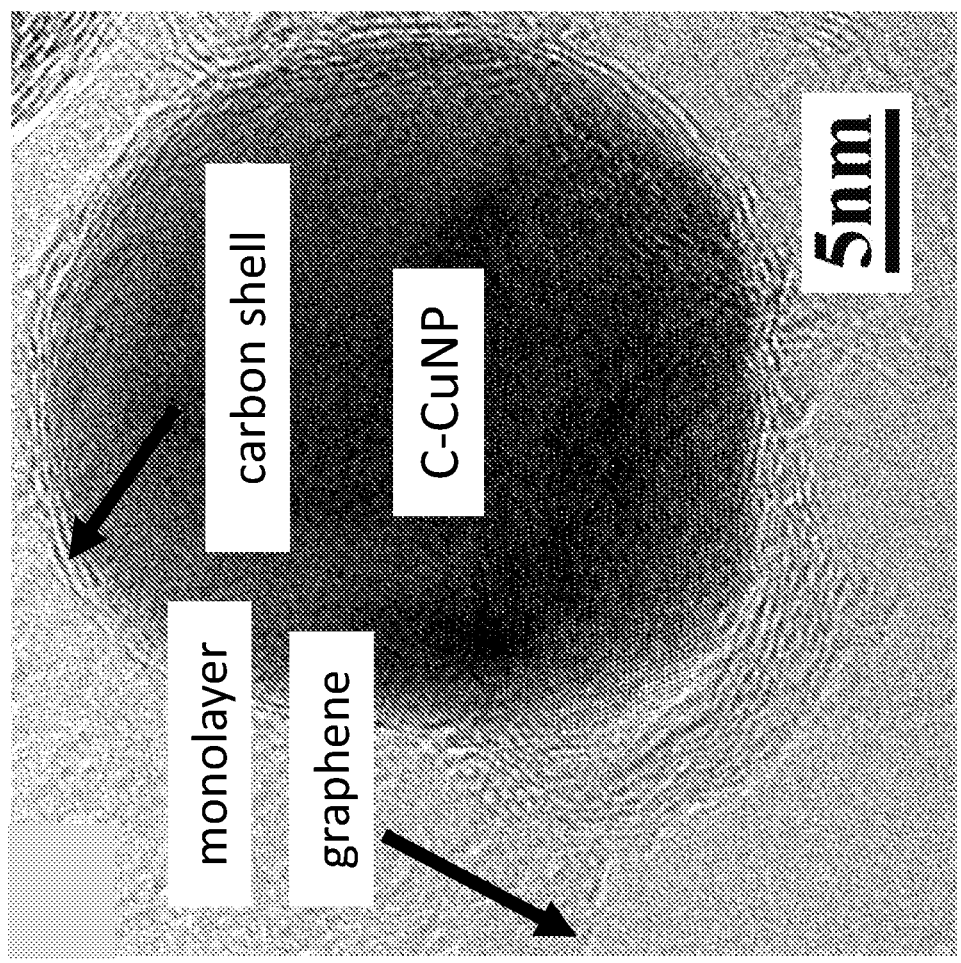
Figure 2I:
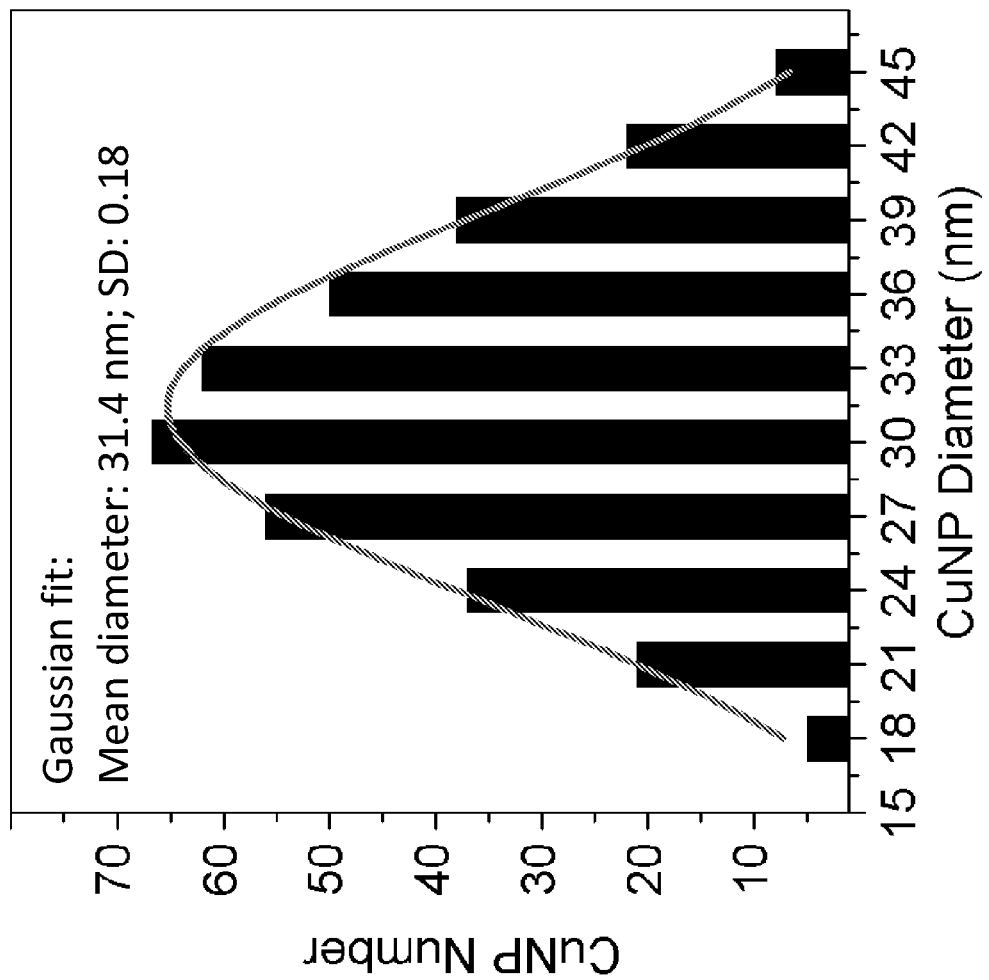

In order to demonstrate the protection afforded by the graphitic shells of the encapsulated Cu cores, the as-synthesized plasmonic C—CuNP/graphene on the SiO$_2$/Si substrate were immersed in concentrated hydrofluoric acid (HI, 40 wt %) for 24 h at room temperature and afterwards peeled off from the substrate surface to float on the solution for cleaning. This HI-peeled plasmonic C—CuNP/graphene was placed on a grid for transmission electron microscopy (TEM). FIG. 2G shows that the majority of the encapsulated C—CuNPs remained on the monolayer graphene. High resolution TEM (FIG. 2H) clearly reveals the Cu—C core-shell structures are without voids, ensuring the long-term stability of the plasmonic C—CuNP/monolayer-graphene. FIG. 2I shows the size of the majority of the C—CuNPs is in the range 15-45 nm with Gaussian mean size of 31.4 nm, which is very near to the optimum dimension for plasmonic applications with low loss.

FIG. 3A compares the optical transmission spectra of the transferred graphene grown on Cu foil and the C—CuNP/graphene grown on fused silica substrates, confirming the enhanced light-matter interactions of the C—CuNP/graphene in visible range. The transferred graphene is highly transparent (i.e., 97.4% at 571 nm) with a nearly flat transmission spectrum in the visible range. In stark contrast, the C—CuNP/graphene spectra show enhanced light-matter interactions in the range of 520-620 nm near the plasmonic resonance peak for CuNPs with a minimum transmission of ~65% at 571 nm. Most importantly, due to the CuNP core seamlessly shielded by the carbon shells, the plasmonic C—CuNP/graphene maintains highly stable optical properties on the same sample measured before and after 12 months stored in air.

Figure 3B:
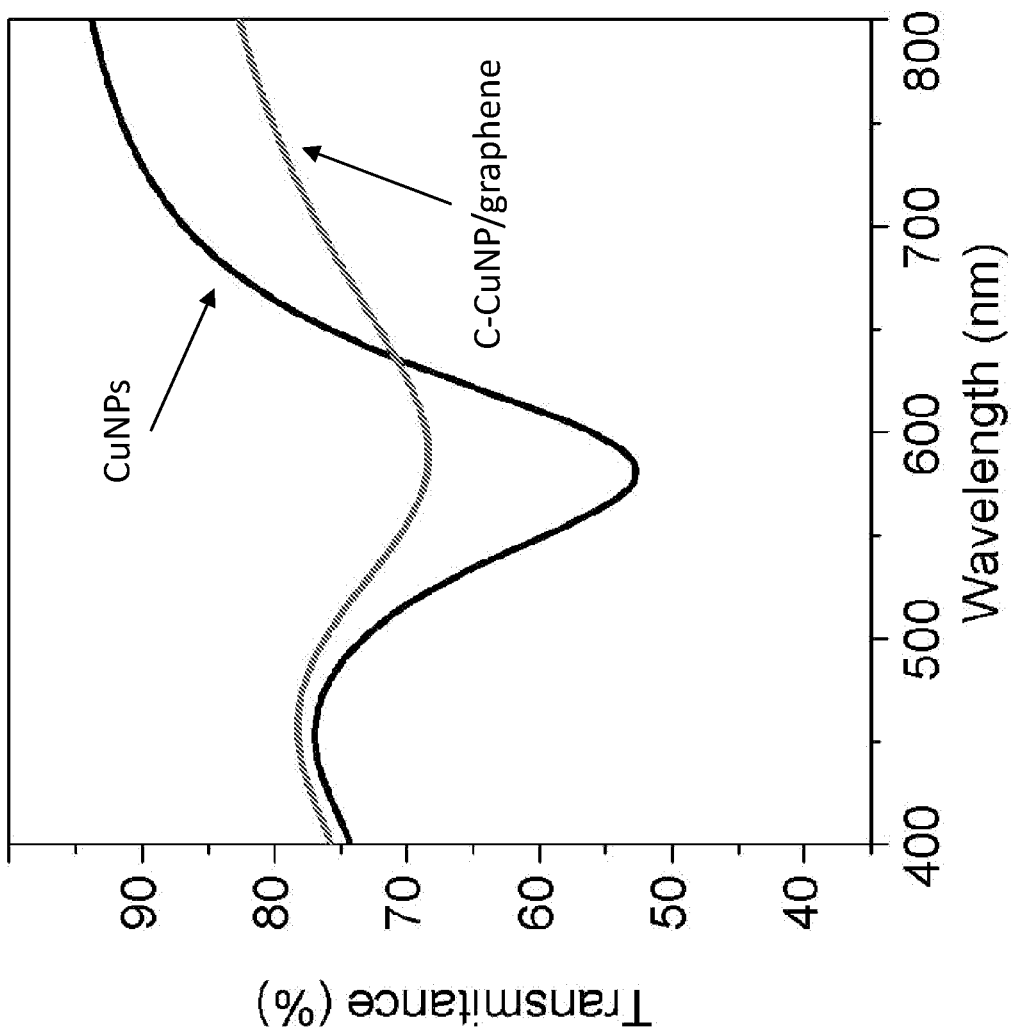
Figures 3D, 3E:
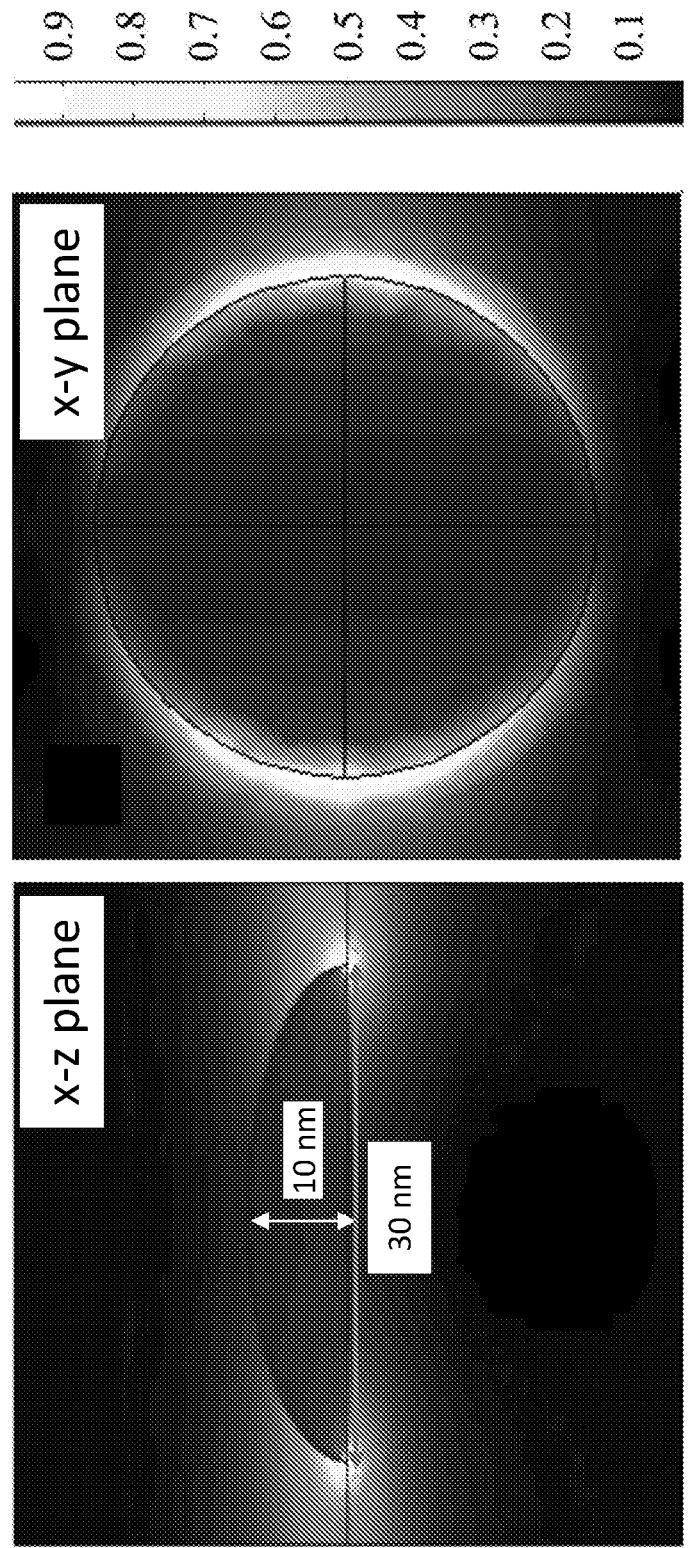

Numerical simulations of the transmittance were also carried out for the CuNPs with and without carbon shells in order to understand the localized surface plasmonic resonance of the plasmonic C—CuNP/graphene. COMSOL Multiphysics based on finite element method was used with the excitation optical field polarized parallel to the graphene surface. The calculated transmittances within the wavelength range between 400 nm and 800 nm are shown in FIG. 3B. The plasmonic resonance spectrum of the C—CuNPs/graphene became broader in comparison to the reference CuNPs only sample. The x-polarized electric field, normalized to the incident field strength on the substrate surface is shown in FIG. 3C. For the same reason, the lower electric field intensity occurs when the CuNP core is encapsulated by carbon shells. This is mainly due to the conductive carbon shells dissipating the evanescent field around the C—CuNPs and thus resulting in the dampening of the plasmonic resonance.[31] FIGS. 3D-E show the simulated intensity distribution of the electrical field around the C—CuNP/graphene on the xz-plane at y=0, and on the xy-plane at z=0, respectively, confirming that the plasmonic C—CuNP/graphene facilitates the scattering of light.

Owing to the well-known surface plasmon resonance effect, plasmonic C—CuNP/graphene focuses incident laser, creating electromagnetic hot spots, and thus, resulting in SERS signals from molecules in close vicinity to the hotspots (i.e., so-called electromagnetic enhancement, the dominant contribution of the SERS enhancement). FIG. 4A illustrates the C—CuNP/graphene enhancing Raman scattering via a plasmonic electric field. In order to estimate the SERS activity of the as-synthesized C—CuNP/graphene, a R6G aqueous solution (5×10$^{-5}$ M) was used to provide probe molecules for Raman. FIG. 4B compares the Raman spectra of R6G obtained on three kinds of substrates, i.e., SiO$_2$/Si, transferred-graphene/SiO$_2$/Si and C—CuNP/graphene/SiO$_2$/Si. The power of the 633-nm excitation laser was kept at a low level of ~1 mW to avoid bleaching R6G molecules. The results show that it is extremely difficult to obtain a Raman spectrum using SiO$_2$/Si (i.e. the spectrum is nearly a straight line), while some R6G peaks of very low intensity were observed on the transferred-graphene/SiO$_2$/Si substrate. By contrast, using the plasmonic C—CuNP/graphene/SiO$_2$/Si substrate, well-defined SERS peaks were clearly observed. The peaks are due to the electromagnetic enhancement from the surface plasmon resonance effect afforded by the plasmonic C—CuNP/graphene. By comparing the intensity of the feature peak of R6G at 1361 cm$^{-1}$, an enhancement factor of one order of magnitude is estimated for R6G on the C—CuNP/graphene/SiO$_2$/Si substrate as compared to the R6G on the transferred-graphene/SiO$_2$/Si reference sample. The sensitivity limit of this C—CuNP/graphene substrate is approximately 5×10$^{-7}$ M R6G concentration. More importantly, because the C—CuNP/graphene has a long-term stability under ambient conditions, no degradation of the SERS of R6G was observed after the C—CuNP/graphene substrate was stored in air over one month.

Summary

In summary, a FCCVD method for in situ synthesis of large-area plasmonic C—CuNP/monolayer graphene has been described. A unique advantage of this process is that it is transfer-free, eliminating contamination of and damage to graphene inherent to the graphene transfer and metal nanostructure fabrication processes. The reactive CuNPs encapsulated by graphitic shells are highly stabile under ambient conditions. The plasmonic C—CuNP/graphene demonstrates a strong visible-light-scattering enhancement and localized surface-enhanced Raman scattering. Moreover, this one-step, low-cost and robust FCCVD technique may be extended for run-to-run, wafer-size growth of other plasmonic metal nanostructures/graphene by pyrolysis of different metal-organic complexes for commercial optoelectronics and sensors.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:
1. A method of making a plasmonic metal/graphene heterostructure, the method comprising:
heating an organometallic complex precursor comprising a metal at a first temperature T$_1$ for a first period of time

$t_1$ to deposit a layer of the metal on a surface of a heated substrate, the heated substrate in fluid communication with the precursor; and heating, in situ, the precursor at a second temperature $T_2$ for a second period of time $t_2$ to simultaneously form on the layer of the metal, a monolayer of graphene and a plurality of carbon-encapsulated metal nanostructures comprising the metal, thereby providing the plasmonic metal/graphene heterostructure, wherein the heated substrate is characterized by a third temperature $T_3$.

2. The method of claim 1, wherein $T_1<T_2<T_3$.

3. The method of claim 2, wherein the organometallic complex precursor is characterized by a vaporization temperature and a decomposition temperature and $T_1$ is greater than the vaporization temperature, $T_2$ is less than the decomposition temperature and $T_3$ is greater than the decomposition temperature.

4. The method of claim 1, wherein $t_1<t_2$ and $t_1$.

5. The method of claim 1, wherein the heating steps are carried out in the presence of a flowing gas.

6. The method of claim 1, wherein the metal of the organometallic complex precursor is selected from Cu, Ag, Au, Ti, Zn, Co, Fe, and combinations thereof.

7. The method of claim 1, wherein the carbon of the carbon-encapsulated metal nanostructures has a thickness consistent with that of a graphene monolayer.

8. The method of claim 1, wherein the substrate is a silicon-containing substrate.

9. The method of claim 1, wherein the deposited layer of metal is ultrathin having an average thickness of no more than 2 nm.

10. The method of claim 9, wherein the deposited layer of metal is continuous.

11. The method of claim 1, wherein the monolayer of graphene and the carbon of the plurality of carbon-encapsulated metal nanostructures provide a continuous carbon layer forming a continuous interface with each metal nanostructure of the plurality of carbon-encapsulated metal nanostructures and with the layer of the metal between neighboring metal nanostructures of the plurality of carbon-encapsulated metal nanostructures.

12. The method of claim 1, wherein the formed monolayer of graphene is characterized by an $I_D/I_G$ value of less than 0.2.

13. The method of claim 1, wherein the carbon-encapsulated metal nanostructures of the plurality of carbon-encapsulated metal nanostructures have an average size in the range of 10 nm to 100 nm.

14. The method of claim 13, wherein a deviation of sizes of the carbon-encapsulated metal nanostructures from the average size is no more than ±1%.

15. A plasmonic metal/graphene heterostructure comprising:
a substrate having a surface;
a layer of a metal on the surface of the substrate; and
a monolayer of graphene and a plurality of carbon-encapsulated metal nanostructures comprising the metal on a surface of the layer of the metal.

16. The heterostructure of claim 15, wherein the carbon of the carbon-encapsulated metal nanostructures has a thickness consistent with that of a graphene monolayer.

17. The heterostructure of claim 15, wherein the substrate is a silicon-containing substrate.

18. The heterostructure of claim 15, wherein the monolayer of graphene and the carbon of the plurality of carbon-encapsulated metal nanostructures provide a continuous carbon layer forming a continuous interface with each metal nanostructure of the plurality of carbon-encapsulated metal nanostructures and with the layer of the metal between neighboring metal nanostructures of the plurality of carbon-encapsulated metal nanostructures.

19. An optoelectronic device comprising the plasmonic metal/graphene heterostructure of claim 15, a source configured to illuminate the heterostructure with electromagnetic radiation, and a detector configured to detect scattered light from the heterostructure.

20. A method of using a plasmonic metal/graphene heterostructure, the method comprising illuminating the plasmonic metal/graphene heterostructure of claim 15 with electromagnetic radiation to excite surface plasmons at a carbon-metal interface therein.

* * * * *